United States Patent
Lee et al.

(10) Patent No.: US 8,094,511 B2
(45) Date of Patent: Jan. 10, 2012

(54) NON-VOLATILE MEMORY DEVICE HAVING HIGH SPEED SERIAL INTERFACE

(75) Inventors: Douglas J. Lee, San Jose, CA (US); Cindy Ho Malamy, San Carlos, CA (US); Kyle McMartin, Mountain View, CA (US); Tam Minh Nguyen, Cupertino, CA (US); Jih Min Niu, Santa Clara, CA (US); Hung Thanh Nguyen, Cupertino, CA (US); Thuc Tran Bui, Sacramento, CA (US); Conrado Canlas Canio, Union City, CA (US); Richard Zimering, Palo Alto, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 264 days.

(21) Appl. No.: 12/623,259

(22) Filed: Nov. 20, 2009

(65) Prior Publication Data

US 2010/0067311 A1 Mar. 18, 2010

Related U.S. Application Data

(62) Division of application No. 11/963,552, filed on Dec. 21, 2007, now Pat. No. 7,660,177.

(51) Int. Cl.
*G11C 7/00* (2006.01)

(52) U.S. Cl. ............... 365/221; 365/189.05; 365/189.08; 365/189.17; 365/230.06; 365/230.08

(58) Field of Classification Search .................. 365/221, 365/189.08, 189.05, 189.17, 230.06, 230.08
See application file for complete search history.

(56) References Cited

U.S. PATENT DOCUMENTS

| | | | | |
|---|---|---|---|---|
| 5,337,281 A * | 8/1994 | Kobayashi et al. | ...... | 365/185.13 |
| 6,172,935 B1 * | 1/2001 | Wright et al. | ............... | 365/233.1 |
| 6,178,132 B1 * | 1/2001 | Chen et al. | ............... | 365/230.02 |
| 6,442,076 B1 * | 8/2002 | Roohparvar | ............ | 365/185.33 |
| 6,668,344 B1 * | 12/2003 | Sakata et al. | .................. | 714/710 |
| 6,697,992 B2 * | 2/2004 | Ito et al. | ......................... | 714/763 |
| 6,721,223 B2 * | 4/2004 | Matsumoto et al. | .......... | 365/222 |
| 6,937,510 B2 * | 8/2005 | Hosono et al. | ............ | 365/185.03 |
| 7,099,200 B2 * | 8/2006 | Sakui | ...................... | 365/185.33 |
| 7,308,524 B2 * | 12/2007 | Grundy et al. | ................. | 711/103 |

* cited by examiner

*Primary Examiner* — Viet Q Nguyen
(74) *Attorney, Agent, or Firm* — DLA Piper LLP (US)

(57) ABSTRACT

A non-volatile memory device comprises an interface circuit for receiving a plurality of signals. The plurality of signals provides multiplexed address and data and command signals in a serial format. An input buffer stores a plurality of the plurality of signals received in serial format and reconstitutes the address, data and command signals, and has an output. A command circuit receives the output of the input buffer and stores the command signals therefrom. An address circuit receives the output of the input buffer and stores the address signals therefrom. A data buffer circuit receives the output of the input buffer and stores the data signals therefrom. An array of non-volatile memory cells stores data from and provides data to the data buffer in response to address signals from the address decoder. A state machine is connected to the command circuit and controls the array of non-volatile memory cells. An output buffer receives data from the data buffer circuit and provides data to the interface circuit.

3 Claims, 4 Drawing Sheets

NON-VOLATILE MEMORY DEVICE HAVING HIGH SPEED SERIAL INTERFACE

CROSS REFERENCE TO RELATED APPLICATIONS

This application is a divisional of U.S. application Ser. No. 11/963,552, filed Dec. 21, 2007, now U.S. Pat. 7,660,177 the entire contents of which is incorporated herein by reference.

TECHNICAL FIELD

The present invention relates to a nonvolatile memory device, and more particularly, a non-volatile memory device having a plurality of high speed serial inputs permitting an execute in place operation to occur within the device.

BACKGROUND OF THE INVENTION

Non-volatile memory devices are well known in the art. There have been two types of interface disclosed with regard to access to a non-volatile memory device: serial and parallel. In a parallel device, the data, address and command lines are typically provided separately to the device, in parallel. Although this architecture requires a large number of pins, the ability to provide data and address in parallel lines, permits what is called execute in place operation, i.e. the memory device can execute a command stored in the non-volatile memory cells. In a serial device, such as that exemplified by U.S. Pat. Nos. 6,038,185 and 5,663,922, the interface to the non-volatile memory device is typically by a single line providing data, address and commands in serial, and multiplexed. Thus, for example, to provide a one byte of data (one byte=8 bits) eight data signals must be provided on the single line. In addition the single line sometimes must also accommodate address signals, as well as command signals in a multiplexed manner. Although a serial device requires a minimal number of pins and can operate at a faster speed, the serial nature of the architecture does not permit execute in place commands. Other prior art that may be relevant include U.S. Pat. Nos. 4,943,962; 5,325,502; 5,991,841, and 7,027,348.

SUMMARY OF THE INVENTION

Accordingly, in the present invention, a non-volatile memory device comprises an interface circuit for receiving a plurality of signals. The plurality of signals provides multiplexed address and data and command signals in a serial format. An input buffer stores a plurality of the plurality of signals received in serial format and reconstitutes the address, data and command signals, and has an output. A command circuit receives the output of the input buffer and stores the command signals therefrom. An address circuit receives the output of the input buffer and stores the address signals therefrom. A data buffer circuit receives the output of the input buffer and stores the data signals therefrom. An array of non-volatile memory cells stores data from and provides data to the data buffer in response to address signals from the address decoder. A state machine is connected to the command circuit and controls the array of non-volatile memory cells. An output buffer receives data from the data buffer circuit and provides data to the interface circuit.

DETAILED DESCRIPTION OF THE INVENTION

Figure 1:
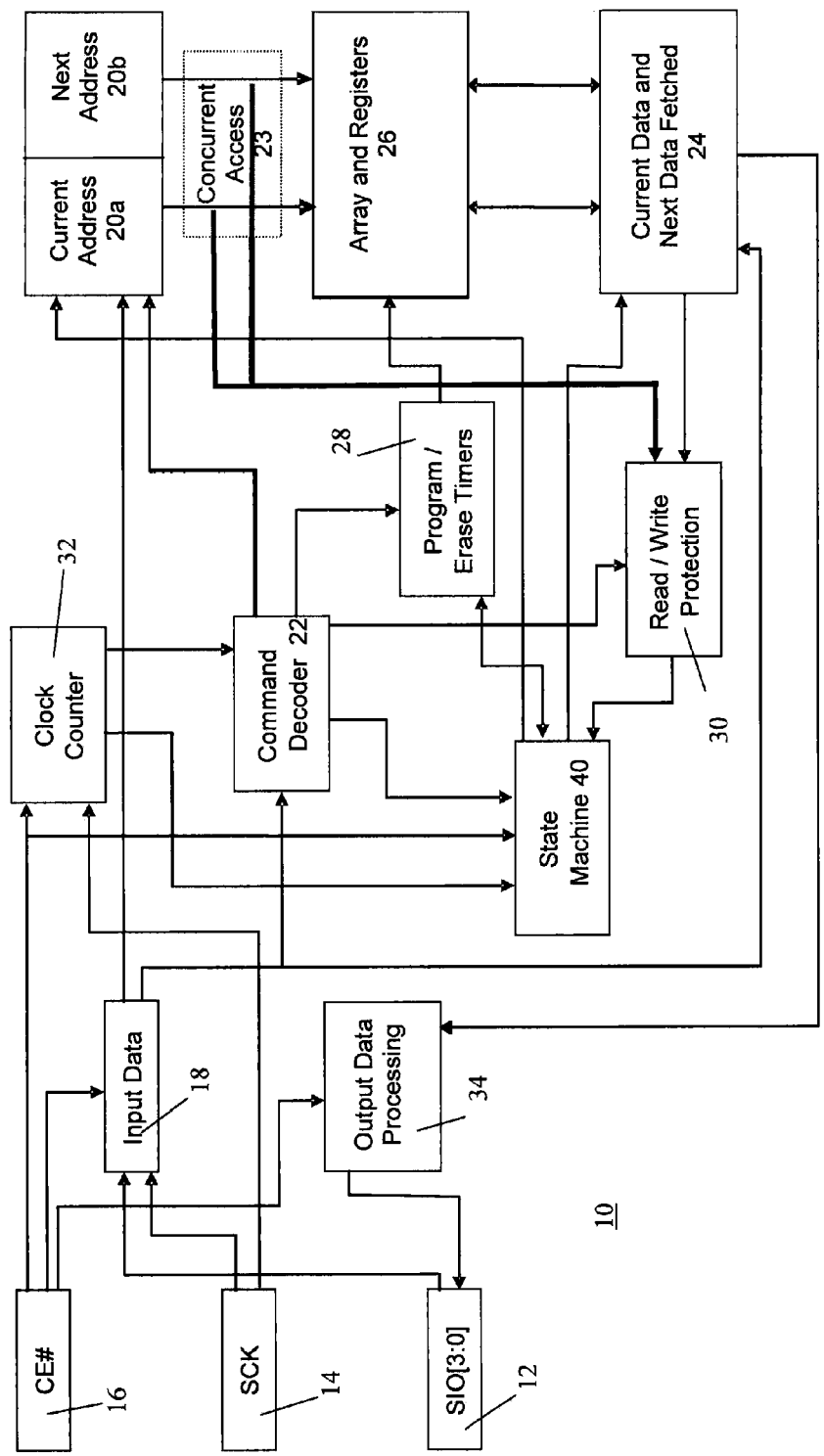
FIG. 1 is a block diagram of the device of the present invention.

Referring to FIG. 1, there is shown a block diagram of the non-volatile memory device 10 of the present invention. The device 10 comprises an interface circuit 12 that has four pins and can receive four signals, or a "nibble", in parallel. The signals provided on each of the pins can be data, address or command. Since it is conventional to provide data in 8 bit format (or a byte), the signals provided on the four pins must be provided in a serial manner for data, i.e. four data signals, followed by another four data signals. In addition to the data signals, the address and command signals must also be provided along the four pins. This must be done in a serial multiplexed format on each of the four pins of the interface circuit 12.

The device 10 also has a clock signal pin 14 for receiving a clock signal. Finally, the device 10 has a CE# pin 16 or chip enable pin, which controls the operation of the device 10.

Within the device 10, the signals received at the four pins by the interface circuit 12, are provided to an input register or input buffer 18. The clock signal received at the clock pin 14 is also provided to the input buffer 18. A first clock signal clocks the signals provided at the interface circuit 12 into one-half of the input buffer 18, while a subsequent clock signal clocks the signals at the four pins from the interface circuit 12 into the adjacent one-half of the input buffer 18. In this manner, after every two clock cycles a byte of the input buffer 18 is filled. The clock signals are also supplied to a clock counter 32. The clock counter 32 indicates whether the nibble stored in the input buffer 18 is the most significant nibble or the least significant nibble.

The data from the input buffer 18 can be routed to either an address buffer 20 (comprising a current address buffer 20a and a next address buffer 20b) or a command circuit 22 or a data register 24. In the preferred embodiment, the first signals on power up, received by the interface circuit 12 is always the command signals. This is followed by a cycle of address signals, and then followed by a cycle of data signals. Thus, the byte or bytes stored in the input buffer 18 are first routed to the command circuit 22 and can be either stored or decoded to be operated by the device 10. Subsequent byte or bytes stored in the input buffer 18 are interpreted as address signals and thus are then routed and stored in the address buffer 20. The final cycle of byte or bytes from the input buffer 18 are routed to the data register 24. The routing of the signals stored in the input buffer 18 is under the control of the clock counter 32.

The address signals from the current address 20a and the next address 20b are both supplied to a concurrent access circuit 23, which can use both addresses (under certain conditions to be discussed hereinafter) to access the array of memory 26. In addition, the current address 20a and the next address 20b are also supplied to a read/write protection circuit 30.

The device 10 also comprises an array of non-volatile memory cells 26. The array 26 is addressed by the address circuit 20, and data read from the array 26 are supplied to the data buffer 24 and then to the output data processing unit 34 or an output buffer 34. The output buffer 34 receives the data from the data register 24 and provides them to the interface circuit 12, in the event data is read from the array 26. Furthermore, the output Data Processing Unit 34 can swap (or re-arrange) data bytes for any even or odd address output. This is a part of concurrent access scheme, which will be discussed hereinafter. It can also output SPI or SQI data to the host. In addition, during programming, data to be stored in the array 26 are first provided to the data buffer 24, then stored in the array 26. Because the array 26 is an array of non-volatile memory cells, control circuits to read or program the non-volatile memory cells are provided in the read/program control circuit 28, which includes various timers associated with the operations of program and erase. The device 10 also comprises a read/write protection circuit 30, which is connected to a state machine 40. The state machine 40 controls the entire operation of the device 10. Various components of the above circuits are described as follows.

The input signals received by the interface circuit 12 are latched on the rising edge of the clock signal received by the clock signal pin 14.

The Command circuit 22 decodes the commands received, e.g. read, chip erase, write enable, etc. The decoded signal is used by the State Machine 40 to determine the next state. The decoded signal is also used by the Program/Erase Timer circuit 28 to select the correct timer. The timer circuit 28 generate various timing signals depending upon the command. Thus, for example, the timer circuit 28 generates a timing signal Tpp, which is the program time, or the timing signal Tse, which is the sector erase time, or the timing signal Tbe, which is the block erase time, or the timing signal Tsce, which is the chip erase time. Finally the decoded signal is used by the Protection circuit 30 (along with the Address circuit 20) to determine if a command is valid.

The State Machine 40 controls the Program/Erase Timer circuit 28 when to start. The Program/Erase Timer circuit 28 sends a signal to the State Machine 40 when a write operation is complete. The address buffer 20 is a three byte wide (or 24 bit wide) register. The State Machine 40 controls when the Address buffer 20 accepts address signals and in which of the three bytes the byte from the input data 18 should be stored. The State Machine 40 also controls when the Data buffer 24 stores the data from the Input buffer 18 or data from the Array 26 and provides that stored data to the output buffer 34.

The Address signals from the address buffer 20 are also routed to the Read/Write Protection circuit 30 to determine if the operation is valid and to the Array 26 to select the appropriate cells.

The Program/Erase Timer circuit 28 controls when the internal program or erase operations are completed.

The Data buffer circuit 24 latches the data from the array 26 during a read operation and routes that data to the Output buffer 34. During a programming operation or register write operation, the data buffer circuit 24 latches the data from the Input buffer 18, and stores it in the array 26.

The Read/Write Protection circuit 30 indicates to the State Machine 40 if an address/command combination is invalid because it is protected.

The device 10 of the present invention can execute three types of read commands: Read Command, Read I Command and Read BI Command. The Read Command is the conventional read command to read from a selected address. The Read I Command is an indexed read command within a sector. Thus, reading would occur from an index from the address of the last read command. This is somewhat analogous to an address jump within the sector. Finally, a Read BI Command is an indexed read which jumps to another block address. Of course, other read commands are also possible. For example, a ReadI Command can be constrained to read from the same word line as the last read address to avoid the inherent RC delay when reading jumps from one word line to another word line. Thus, in a ReadI Command the extra latency associated with the wordline RC can be avoided, and in the protocol for the ReadI Command the dummy cycle can be reduced from two cycles to one cycle or even zero cycle. Thus, for example, in a ReadI command both the current address and the next address stored in the address buffer 20 can be executed at or nearly the same time.

Figure 2:
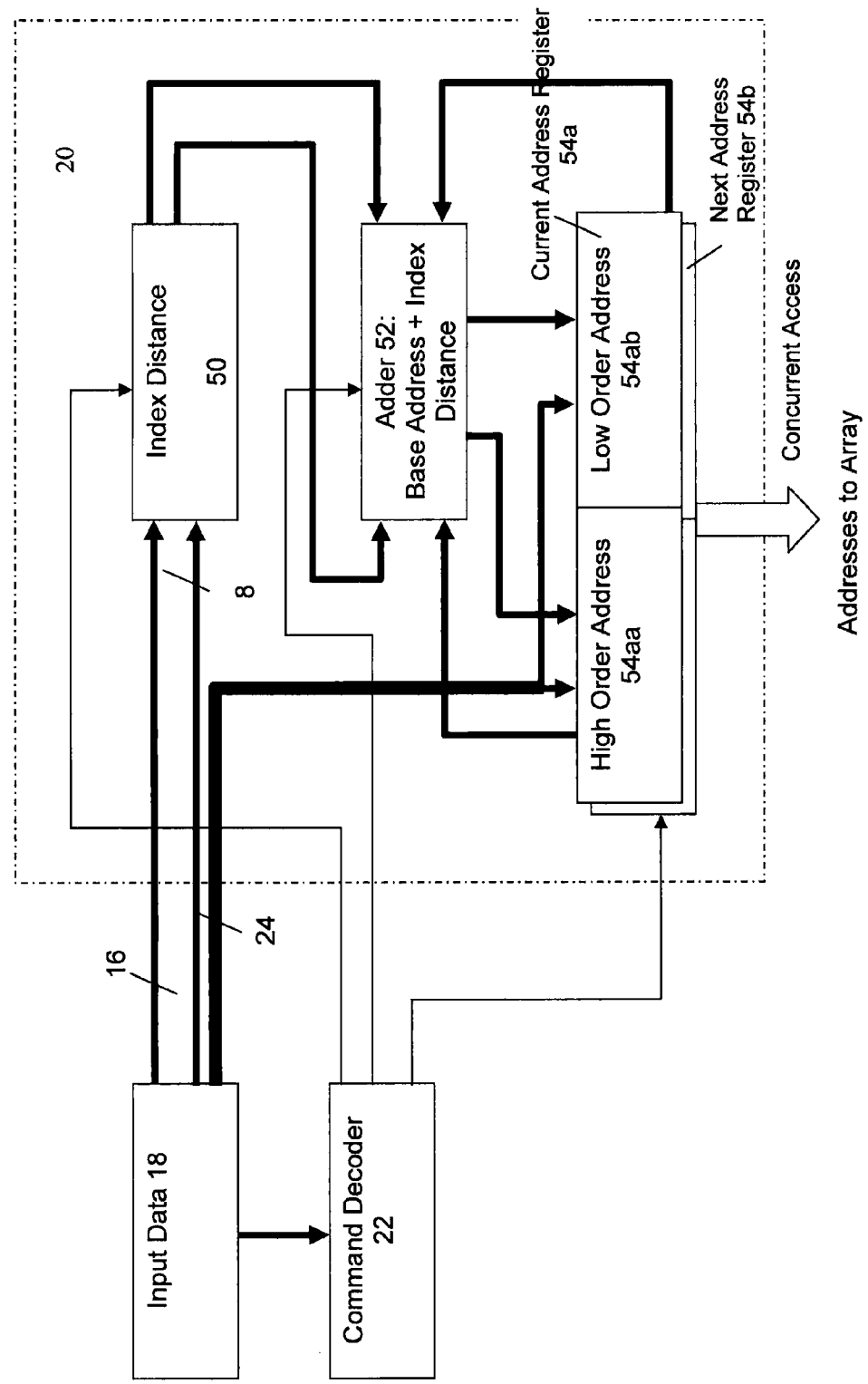
FIG. 2 is a detailed block diagram of a portion of the addressing circuit portion of the device of the present invention.

Referring to FIG. 2 there is shown a detailed block diagram of a portion of the device 10 of the present invention showing the operation of the device 10 in performing the read commands. As discussed above, the device 10 can accept 24 bits of address signals or 3 bytes. There are two address registers: 54*a* and 54*b*. The address register 54*a* is associated with and stores the address signals for the current address while the address register 54*b* is associated with and stores the address signals for the next address. Each of the address registers 54*aa/ab* (or 54 *ba/bb*) has a high order address register and a low order address register. Thus, for example, the address register 54 *aa/ab* associated with the current address register 54*a* collectively comprises three bytes with the upper order address register 54*aa* comprising 1 byte while the lower order address register 54*ba* comprising two bytes. Within the address circuit 20 is also an Index Distance register 50. The index register 50 stores the address signals supplied from the input data buffer 18. The address signals from the Index Distance register 50 are then supplied to the adder 52. Either the lower order two bytes of address signals from the address register 54*ab* (or 54*bb*) or the upper order one byte of address signals from the address register 54*aa* (or 54*ba*) are also supplied to the adder 52. The adder 52 performs a two's complement addition operation on the address signals from the register 50 with the address signals from the address register 54 *aa/ab* (or 54 *ba/bb*). The result of the operation is then supplied to either the upper order address register 54*aa* (or 54 *ba*) or the lower order address register 54*ab* (or 54 *bb*), as the case may be.

During the Read I command, the command decoder 22 causes two bytes of address signals from the input buffer 18 to be latched into the index register 50. The Command decoder 22 also enables the adder 52 causing the adder 52 to add the two bytes of the address signals from the index register 50 with the two lower bytes of address signals from the address register 54*ab* (or 54*bb*) in a two's complement operation. The result is then stored in the lower order two bytes in the address register 54*ab* (or 54*bb*). Thus, in a Read I command the upper order one byte of address signals stored in the address register 54*aa* (or 54*ba*) is unaffected. The entirety of the address signals from the address register 54 *aa/ab* (or 54 *ba/bb*) is then supplied to the array 26.

During the Read BI command, the command decoder 22 causes one byte of address signals from the input buffer 18 to be latched into the index register 50. The Command decoder 22 also enables the adder 52 causing the adder 52 to add the one byte of the address signals from the index register 50 with the upper one byte of address signals from the address register 54*aa* (or 54 *ba*) in a two's complement operation. The result is then stored in the upper order one byte in the address register 54*aa* (or 54 *ba*). Thus, in a Read BI command the lower order two bytes of address signals stored in the address register 54*ab* (or 54*bb*) is unaffected. The entirety of the address signals from the address register 54 *aa/ab* (or 54 *ba/bb*) is then supplied to the array 26.

Finally in a Read Command, the three bytes of address signals from the input data buffer 18 are loaded directly in the address registers 54 *aa/ab* (or 54 *ba/bb*) directly, and the entirety of the address signals from the address register 54 *aa/ab* (or 54 *ba/bb*) is supplied to the array 26.

By using an adder 52 with two's complement addition between the index address signal supplied from the input data buffer 18 and the current address signal stored in either the address register 54*aa* or register 54*ab*, one can "jump" quickly to a new address in the array 26 without the necessity of supplying an entire address signal, i.e. 3 bytes. Thus, using one byte (for Read BI Command) or two bytes (for Read I Command), the location of a new address can be specified without supplying all three bytes, as in a Read Command. This provides a way to saves time in supplying the address signals during certain read operations. As discussed hereinabove, with both Read I Command and Read BI Commands, the read can be indexed from the current or last read address. Thus, it is not necessary to supply the full address and only the index or the offset address needs to be supplied. Furthermore, with a Read Command the address signal is stored, from which subsequent index reads, such as Read I Command, or Read BI Command or ReadI command are indexed from the address stored for the Read Command. Since the address for the Read Command is stored, the Read address from which all the index reads occur can be reverted to after the index Read operation is performed. Thus, one can perform a multitude of index read operations after a Read Command, using e.g. 2's complement operation. In addition, a plurality (e.g. "n") number of addresses can be stored in a register, e.g. a stack, to allow for nested jumping returns.

Figure 3:
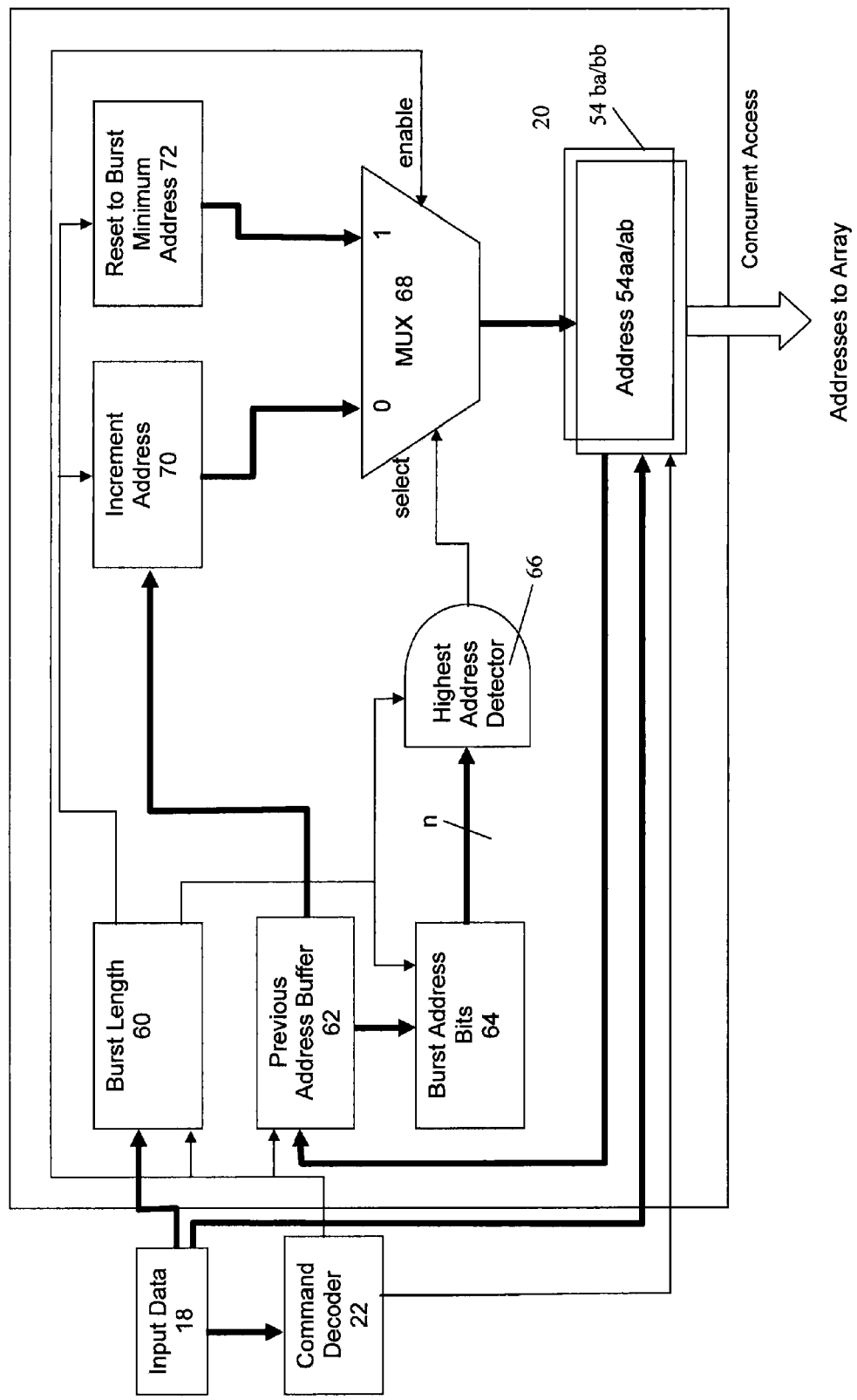
FIG. 3 is a detailed block diagram of another portion of the addressing circuit portion of the device of the present invention showing the operation of the device of the present invention in a burst read mode.

Referring to FIG. 3 there is shown a detailed block diagram of another portion of the addressing circuit 20 of the device 10 of the present invention suitable for executing a burst mode read operation. The address circuit 20 further comprises a burst length register 60, a previous address buffer 62 and a burst address bits register 64. In addition, the address circuit comprises an AND gate 66, an incremental address register 70, a reset to Burst Minimum Address 72 register, and a multiplexer 68.

In the operation of the Read Burst command, the command is first decoded by the Command decoder 22. Upon decoding of the Burst Read command, the command decoder 22 enables the address register 54 *aa/ab* (or 54*ba/bb*) to accept the three bytes of address signals from the input data buffer 18. The three bytes stored in the address register 54 *aa/ab* (or 54*ba/bb*) represent the starting address for the burst read command. In addition, the command decoder 22 enables the Burst length register 60 by loading the burst length data from the input data buffer 18. Typically, the burst length data can be 8, 16, 32 or even 64 bytes in length. The command decoder 22 also causes the three bytes of address signals previously stored in the address register 54 *aa/ab* (or 54 *ba/bb*) to be stored in the previous address buffer 62. Finally, the command decoder 22 enables the multiplexer 68.

In operation the Burst Length 60 stores the length of the burst read data to be read. Once the length of the burst is read, the address resets to the beginning of the burst. The Burst Length 60 has a default value that can be changed with the Set Burst command. The Burst Length is set before the commencement of a Read Burst command. The multiplexer 68 determines that once the number of least significant bits corresponding to the Burst Length, e.g. A[2:0] for 8 Byte burst, A[3:0] for 16 Byte burst, etc, are all '1' they are reset to '0' and the burst operation starts over.

To implement Burst Read with zero latency each burst is address aligned, i.e. when the least significant address bits corresponding the Burst Length (A[2:0] for 8 Byte burst, A[3:0] for 16 Byte burst, etc.) are all '1' they get reset to '0' so the next address is the beginning of the burst regardless of the original input address. To avoid latency or delay caused by the wordline RC when switch wordlines, the device 10 has a pipeline of address registers 54*aa/ab* and 54*ba/bb*, allowing multiple independent bytes to be accessed at the same time. The dual address registers 54*aa/ab* permit concurrent access operation. Before the end of a wordline is reached, the first address on the next word line is already being accessed allowing for seamless transitions between wordlines. This can be seen with reference to FIG. 4.

Figure 4:
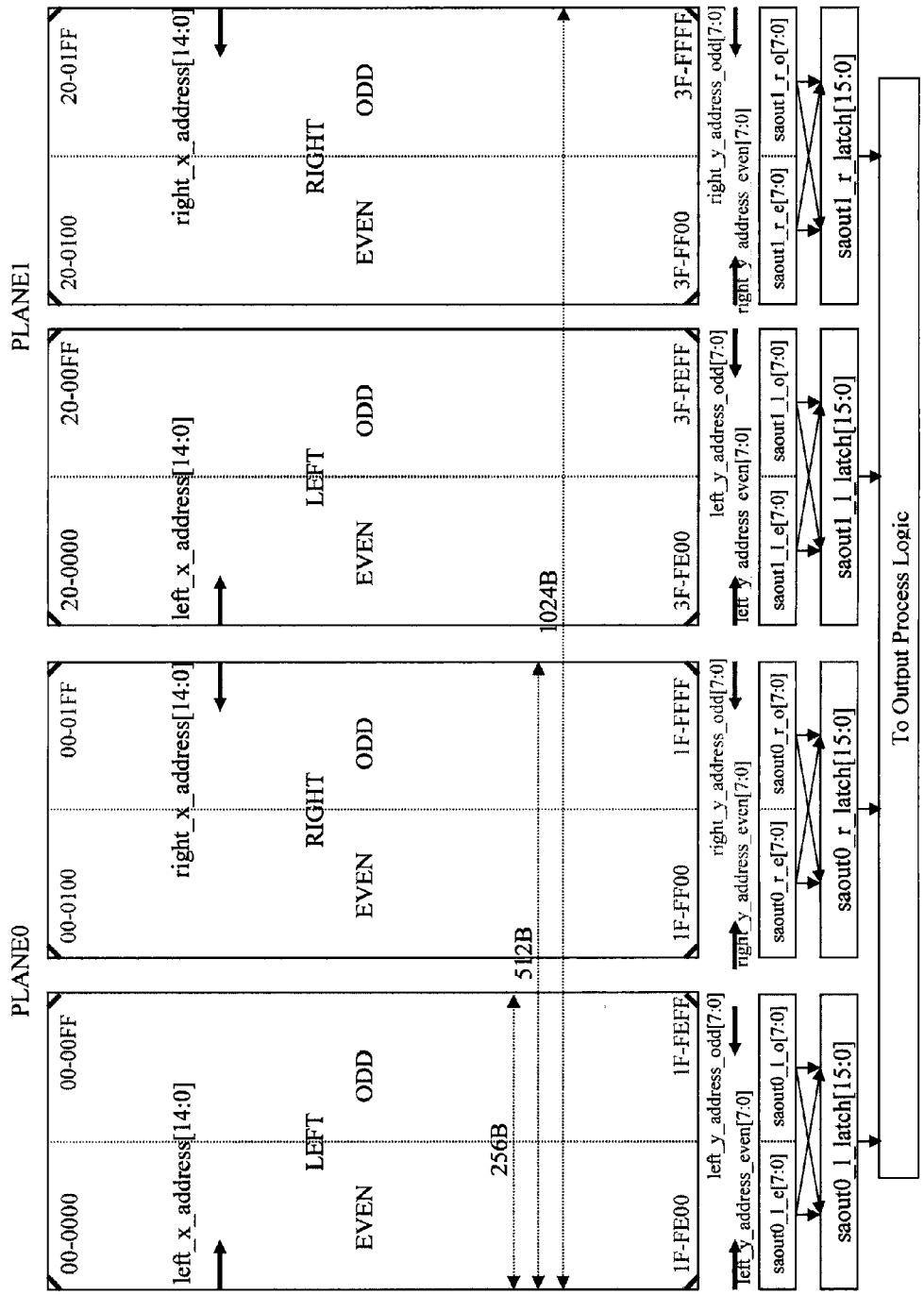
FIG. 4 is a top plan logic view of one embodiment of a memory array suitable for use in the device of the present invention.

FIG. 4 shows the logical view of the layout of the array of non-volatile memory cells 26. In one preferred embodiment, the device 10 can store 32 Mbits. The 32 Mbits are stored in two separate planes of memory cells: Plane 0 and Plane 1. Each plane of memory cells is further divided into a "Left" SubPlane and a "Right" SubPlane. Within the "Left" SubPlane is an Even half subplane of memory cells, with another half subplane of the memory cells in the Odd half subplane. Thus, each Plane, e.g. Plane 0 of memory cells comprises a Left Even half subplane, a Left Odd half subplane, a Right Even half subplane and a Right Odd half subplane. Similarly, the Plane 1 of memory cells comprises a Left Even half subplane, a Left Odd half subplane, a Right Even half subplane and a Right Odd half subplane. The logical assignment for addressing purpose is that 256 bits are addressed when one row (or wordline) of memory cells in the Left Even half subplane and the Left Odd half subplane in Plane 0 is addressed. Thus one row (or wordline) of the Left Subplane stores 215 bits. 512 bits are stored in one row (or wordline) of memory cells in Plane 0. Finally 1024 bits are stored in one row (or wordline) of memory cells in both Plane 0 and Plane 1. It should be noted that the word line physically does not extend across from one Subplane (e.g. Left Subplane of Plane 0) to another Subplane (e.g. Right Subplane of Plane 0) of memory cells. The word line extends from one Subplane to another for logical addressing purpose. Thus, when it is desired to read in the Burst Read mode from one Subplane to another Subplane, e.g. from Left Subplane of Plane 0 to the Right Subplane of Plane 0, the device 10 of the present invention can accomplish the Burst Read operation without a delay in switching across the wordline by addressing the word line in the Right Subplane as the cell in the Left Subplane is being read. In this manner through the use of the Current address 20*a* and the Next address 20*b*, the word line latency is minimized. Similarly, wordline latency is minimized when address memory cells across from Plane 0 to plane 1. Thus, 1024 bits can be read in a Burst mode without any wordline latency. Furthermore, once the memory cells from the word line in the Odd half subplane of the Right Plane 1 is being read, the wordline in the Left Subplane of Plane 0 can be accessed, thereby minimizing wordline latency as more than 1024 bits are read. The data is then supplied to the Output Data Processing Unit 34, which as previously described, can swap (or re-arrange) bytes to adapt to any even or odd address access requested by the user.

The device 10 is also compatible with the single pin SPI serial device protocol of the prior art and can operate and respond to the prior art SPI commands. Upon power-up the device 10 is configured as SPI with a single input (SI/SIO0) and a single output (SO/SIO1), and is responsive to a READ command of the SPI command set. The configuration can be changed to four multiplexed I/Os by writing either a register in the Command decoder 22 (not shown). The Command decoder 22 orders 1) output process logic and 2) input data unit to transfer data in SPI or SQI mode. Once the register is written into, the Command decoder 22 recognizes that further signals supplied on the input 12 are treated in accordance with the protocol described herein.

From the foregoing description, it can be seen that a number of features are implemented with the device 10 of the present invention.

First, due to the nature of the protocol, (number of clock cycles, zero latency at the end of the wordline in continuous burst and/or burst wrap on 8, 16, 32, 64 B bursts, index reads, and high speed allow), execute in place operation results. Thus, a read, program or erase command is executed entirely within the device 10, without further assistance from a host external to the device 10. The first key to execute in place operation is the data output rate. The protocol, by its nature, is able to achieve greater data output rate over the prior art by transferring data on multiple I/Os instead of one (as in the case of the prior art serial device), thereby reducing the input overhead required to access the memory and the number of clocks required to output a full byte. Execute in place requires zero latency and the ability to operate at end of a wordline; and with faster clock frequencies. The device 10 can accomplish the foregoing. The second key to execute in place operation is compatibility between the controller's algorithms and the flash memory's commands. Controllers need to access a fixed number of bytes of data multiple times before moving to the next set of data. The Burst Read command automatically wraps around to the beginning of the burst when it reaches the end, thus allowing the controller to continuously read the same data burst multiple times without resending the starting address. The Read Index and Read Block Index commands make the addresses relative instead of absolute and thereby allowing faster access time as it reduces the number of input clocks required. Thus with these commands, i.e. Burst Read, Read Index, and Read Block Index, device 10 is compatible with the data flow requirements of controllers.

Second, the device 10 permits continuous reading with zero latency at the end of word line to the next word line. There are a number of methods to accomplish this operation. One method has been described above, by permitting multiple independent bytes to be accessed at the same time. Before the end of one wordline is reached, the first address on the next wordline is already being accessed allowing seamless transition between the word lines.

Third, by using the Read BI Command, one can perform an indexed read between a first block and a second block of data. A previous address is stored internally. When the Read Block Index command is recognized, the index address (input after the command) is added to the previously stored address. Only the most significant byte of address is affected. The two least significant bytes of the new address will be the same as those of the stored address. See FIG. 2 and the description thereof.

Fourth, by using the Read I Command one can perform an indexed read within a block of data. A previous address is stored internally. When the Read index Command is recognized the index address (input after the command) is added to the previously stored address. Only the two least significant bytes of address are affected. The most significant byte of the new address will be the same as that of the stored address. See FIG. 2 and the description thereof.

Fifth, based upon the foregoing description, with the address for the Read Command stored in the stack, after an index read command, the original address for the Read Command can be retrieved and restored to the top of the stack. Thus, one can perform an end of read cycle address capture for push/pop return to the initial address.

What is claimed is:

1. A non-volatile memory device comprising:
   an interface circuit for receiving a plurality of signals, including address signals and command signals;
   an input buffer for storing said plurality of signals received;
   a command circuit for receiving the output of said input buffer, and for controlling said device in response to the command signals received;
   a plurality of address registers for receiving the output of said input buffer for storing a plurality of address signals therefrom;
   a data buffer circuit for receiving the output of said input buffer for storing the data signals therefrom;
   an array of non-volatile memory cells, said array having a plurality of sub-arrays each of said sub-array being independently addressable; said array of non-volatile memory cells for storing data and for providing data in response to the plurality of address signals from the plurality of address registers; and
   wherein said command circuit for controlling the addressing of said array of non-volatile memory cells and for providing a plurality of continuous data in response to the plurality of address signals from the plurality of address registers.

2. The device of claim 1 wherein each sub-array of non-volatile memory cells is characterized by a plurality of word lines, with each word line extending only within a sub-array, and each word line having a plurality of non-volatile memory cells connected thereto, and wherein said command circuit for accessing a word line of one sub-array with an address signal from one of said plurality of address registers, while substantially simultaneously accessing a word line of another sub-array with an address signal from another one of said plurality of address registers, thereby providing a plurality of continuous data in response to the plurality of address signals from the plurality of address registers.

3. A non-volatile memory device comprising:
   an interface circuit for receiving a plurality of signals, including address signals and command signals;
   an input buffer for storing said plurality of signals received;
   a command circuit for receiving the output of said input buffer, and for controlling said device in response to the command signals received;
   an address register for receiving the output of said input buffer for storing an address signal therefrom, and having a two's complement adder;
   a data buffer circuit for receiving the output of said input buffer for storing the data signals therefrom;
   an array of non-volatile memory cells for storing data and for providing data in response to the address signal from the of address register; and
   wherein said command circuit for controlling the addressing of said array of non-volatile memory cells and for providing a plurality of continuous data in response to the address signal from the address register, ands for controlling the indexing of the address signal using the two's complement adder.

* * * * *